United States Patent [19]

Kushibiki et al.

[11] Patent Number: 4,901,138
[45] Date of Patent: Feb. 13, 1990

[54] SEMICONDUCTOR CONVERTER

[75] Inventors: Ryoichi Kushibiki, Kiyose; Tadamichi Fukutake, Hanno, both of Japan

[73] Assignee: Kabushiki Kaisha Toshiba, Kawasaki, Japan

[21] Appl. No.: 127,393

[22] Filed: Dec. 2, 1987

[30] Foreign Application Priority Data

Dec. 4, 1986 [JP] Japan .............................. 61-186172[U]

[51] Int. Cl.[4] ..................... H01L 23/34; H01L 23/46
[52] U.S. Cl. ...................................................... 357/81
[58] Field of Search ................... 357/81, 82; 165/80 B, 165/80 C, 80 D, 85, 108

[56] References Cited

FOREIGN PATENT DOCUMENTS

| 59-177997 | 10/1984 | Japan . |
| 60-8475 | 3/1985 | Japan . |
| 62-10444 | 1/1987 | Japan . |
| 62-73592 | 5/1987 | Japan . |
| 62-73593 | 5/1987 | Japan . |
| 62-73594 | 5/1987 | Japan . |

Primary Examiner—Rolf Hille
Assistant Examiner—S. V. Clark
Attorney, Agent, or Firm—Foley & Lardner, Schwartz, Jeffery, Schwaab, Mack, Blumenthal & Evans

[57] ABSTRACT

A semiconductor converter is provided with a cooling structure for cooling semiconductor units, resistors, and the like elements disposed in the housing of the semiconductor converter. A cooling air introduced into the housing through a cooling air intake port first cools the semiconductor units and the diverged cooling air flows after cooling the semiconductor units are converged at the location of a duct or passage formed between the semiconductor units and the resistors. The converged cooling air flow is directed towards the resistors to cool the same from the lower ones to the upper ones or vice versa in turn. An electric fan is installed in the air intake port or cooling air exhaust port for effectively circulate or flow the cooling air in the semiconductor converter.

6 Claims, 4 Drawing Sheets

SEMICONDUCTOR CONVERTER

BACKGROUND OF THE INVENTION

This invention relates to a semiconductor converter, provided with an improved cooling structure, such as an inverter or a rectifier provided with a heat generating element such as a resistor or a semiconductor element such as a thyrister or a gate turn-off thyrister (GTO).

Recently, in accordance with rapid development of power semiconductor elements, integrated circuits (IC), and large scale integration (LSI) technique, electronic parts or elements have been made more compact with high density. Moreover, the improvement in packing technique for assembling and wiring of these electronic parts or elements to operate as a combined unit or equipment makes compact or multi-functional a whole converter device or unit. In addition, the power semiconductor element of large capacity has been extremely developed, and accordingly, a power semiconductor element with a rated value of several thousands of amperes has been generally used. According to the technological development described above, there has been produced a semiconductor converter in which each one cubicle outputs several megavolt-amperes (MVA). Thus, the packing density of the electronic parts and the like in the semiconductor converter and the heat generated from the heat generating elements such as semiconductor elements or resistors have been increased in the form of an exponential function.

Accordingly, it becomes a significant problem or subject to improve a cooling method of the semiconductor converter to attain reliability of structure thereof.

FIG. 5 shows a diagram of a conventional circuit of a semiconductor converter assembled in an inverter circuit which converts a direct current (DC) into an alternating current (AC). As cooling means for such semiconductor converter, a cooling structure or unit of the type shown in FIGS. 6, 7 or 8 is generally used. The semiconductor converter shown in FIG. 5 essentially comprises a DC input reactor 1, a capacitor 2, and a plurality of semiconductor units 3 each consisting of a GTO, a diode and a snubber circuit with resistors 4 for the capacitor 2, which are electrically operatively connected.

FIG. 6 is a side view of a semiconductor converter of conventional type in which two sets of the circuits shown in FIG. 5 are installed. FIG. 7 is a cross sectional plan view taken along the line VII—VII shown in FIG. 6. In the semiconductor converter shown in FIG. 6, cooling is effected by circulating air through the operation of a cooling fan 5 secured to the ceiling of the semiconductor converter 9. The air for cooling is introduced into the semiconductor converter 9 through an air intaking port 8 with a filter 7 formed in a lower portion of a door 6 of the converter 9, and diverges to cool the respective semiconductor units 3 and then the resistors 4 disposed behind the semiconductor units 3, thereafter being discharged externally through an air discharging port 10. The reactor 1 and the capacitor 2 are located further behind the resistors 4, and guide plates 11a and 11b are located at upper and lower portions of the resistors 4 for effectively cooling the resistors 4, but these guide plates 11a and 11b may be eliminated as shown in FIG. 8. The resistance used for the resistors 4 of the snubber circuit has a certain relationship existing between the cooling velocity and the maximum working electric power as shown in FIG. 9, and accordingly, the number of the resistors 4 to be used in the converter is determined by the degrees of the working electric power and the cooling velocity.

The cooling structure for the conventional semiconductor converter of the character described above reveals the following disadvantages.

In the semiconductor converter having the cooling structure of the type shown in FIG. 6, since the resistors 4 are cooled by the cooling air diverging before cooling the semiconductor units 3, the velocity of the cooling air relative to the resistors 4 is reduced. Also with the semiconductor converter having the cooling structure of the type shown in FIG. 8, the resistors 4 located at relatively upper portions can be cooled by the cooling air having a relatively high velocity, whereas the resistors 4 located in relatively low portions are cooled by the cooling air with a velocity further lower than the velocity of the cooling air for cooling the resistors equipped with the guide plates 11a and 11b shown in FIG. 6. Since the number of the resistors 4 installed in the converter is determined by the lowest cooling velocity, a larger number of the resistors 4 are provided in the converter shown in FIG. 8 than that of the converter shown in FIG. 6.

Moreover, due to the development of the semiconductor converter of large capacity, the working electric power for the resistors 4 increases and the number of resistors to be used increases, accordingly. This tendency, however, does not comply with the requirement of the development of a compact structure of the semiconductor converter, and accordingly, it is impossible to increase the number of the resistors to be installed in the semiconductor converter in proportion to the increment of the working power. This fact requires increase of the velocity of the cooling air. In the converter shown in FIG. 6, however, it is required for the cooling fan 5 to have an increased capacity in order to increase the air velocity for cooling the resistors 4, and hence, it is necessary to increase the overall size of the cooling fan 5, which results in increase of the cost for the installation of the whole structure of the converter. In addition, since the increase of the cooling capacity of the cooling fan 5 in turn results in increase of the head loss at the filter 7, the semiconductor units 3 and the like in proportion to the square of the air velocity, effective increase of the velocity of the cooling air for cooling the resistors 4 in proportion to the increase of the cooling capacity of the fan 5 cannot be expected. Moreover, in the conventional cooling structure, the resistors 4 are located at directly downstream-side of the semiconductor units 3 for effectively cooling the same, so that the cooling air with an increased temperature which has cooled the semiconductor units 3 and the resistors 4 is directed to the capacitor 2. This involves a significant problem because the capacitor widely used in these days has very low heat resisting property, and accordingly, it is not desired to direct the cooling air with an increased temperature to the capacitor.

SUMMARY OF THE INVENTION

An object of this invention is to eliminate defects or drawbacks encountered with the prior art described hereinbefore and to provide a semiconductor converter provided with an improved compact cooling structure capable of effectively cooling semiconductor units and heat generating elements such as resistors installed in the semiconductor converter with high reliability.

This and other objects can be achieved, according to this invention, by providing a semiconductor converter with a cooling structure comprising a housing provided with a panel board, for instance a door, a cooling air intake port formed in the panel board, for introducing cooling air into the housing, a plurality of semiconductor units installed in the housing on the side of the front door, a plurality of resistors accommodated in the housing behind the semiconductor units with respect to the direction of the flow of the cooling air, a cooling air duct or passage formed between the semiconductor units and the resistors so that the cooling air diverging for cooling the semiconductor units is converged and the converged cooling air flow is directed towards the resistors to cool the same in turn from lower ones to upper ones or vice versa, and a cooling air exhaust port for discharging the cooling air after cooling the resistor.

In a preferred embodiment, an electric fan is installed in the cooling air intake port or cooling air exhaust port for forcibly circulating or flowing the cooling air in the semiconductor converter.

DESCRIPTION OF THE PREFERRED EMBODIMENTS

Figure 1:
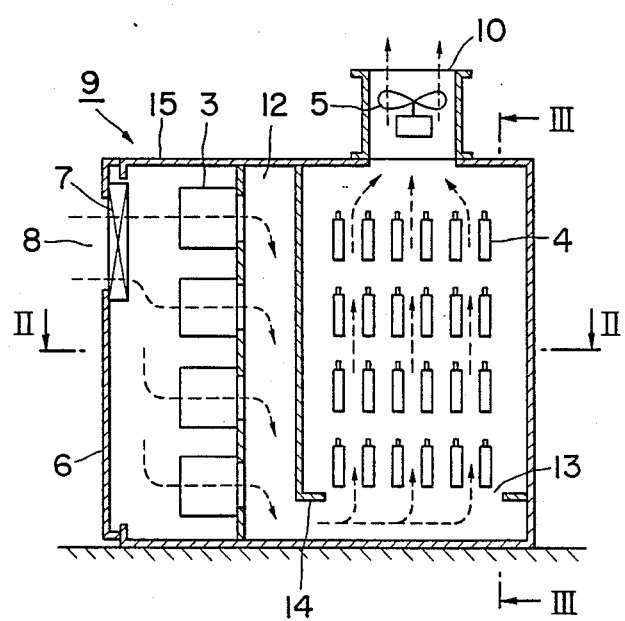
FIG. 1 is a side view, in vertical section, of an embodiment the semiconductor converter according to this invention.
Figure 2:
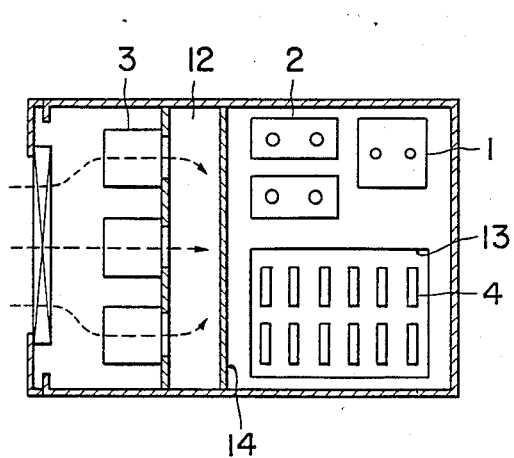
FIGS. 2 and 3 are cross sectional views of the semiconductor converter shown in FIG. 1, taken along the lines II—II and III—III in FIG. 1, respectively.
Figure 3:
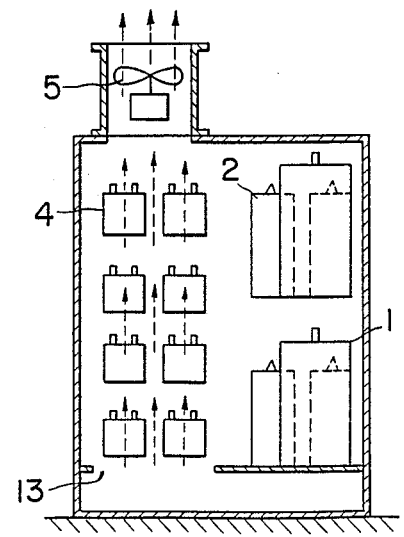
Figure 5:
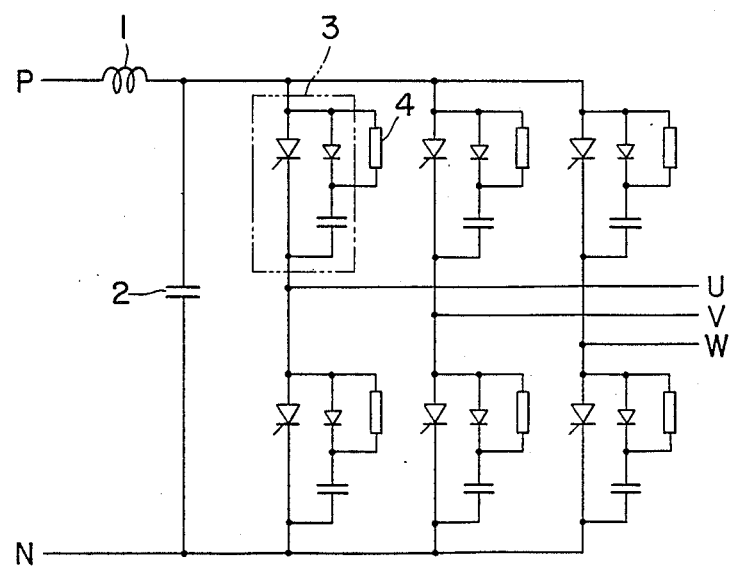
FIG. 5 is a diagram of a circuit of a typical example of a semiconductor converter to which a cooling structure according to this invention can be used.
Figure 6:
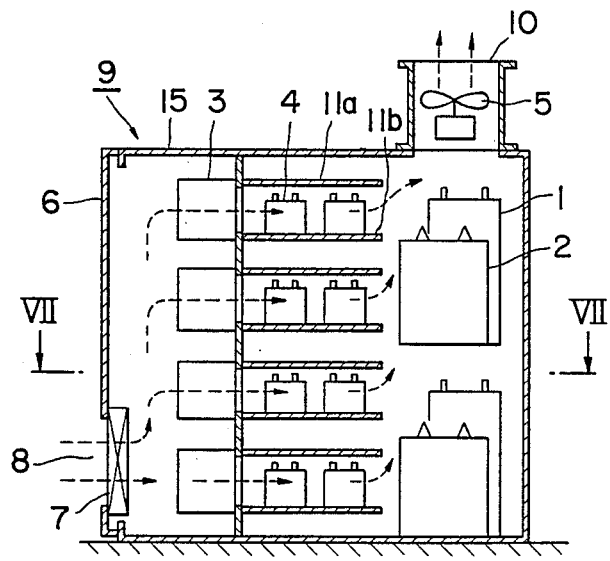
FIG. 6 is a side view, in vertical section, of one example of a conventional semiconductor converter.
Figure 7:
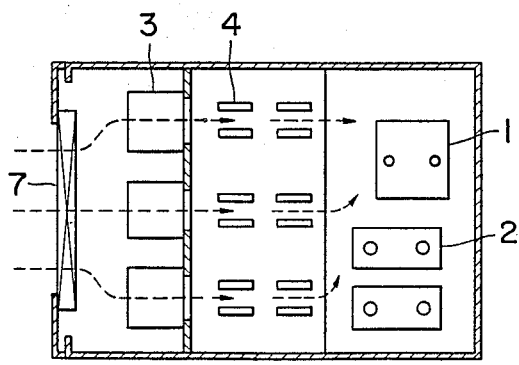
FIG. 7 is a cross sectional view of the semiconductor converter shown in FIG. 6 taken along the line VII—VII in FIG. 6.
Figure 8:
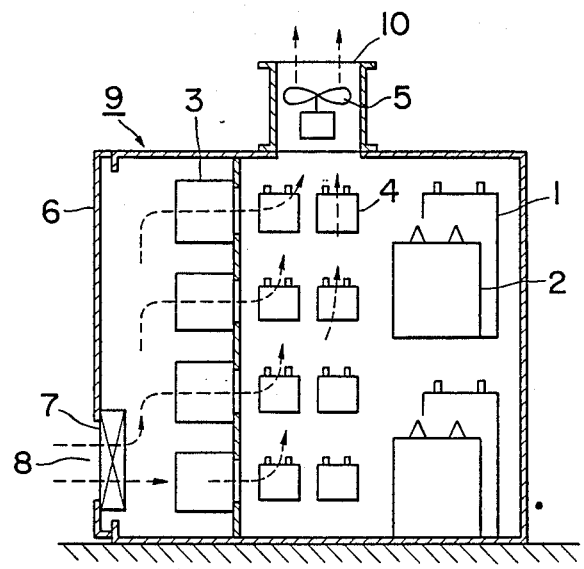
FIG. 8 is a side view, in vertical section, of another example of a conventional semiconductor converter.

FIG. 1 shows a side view, in vertical section, of a semiconductor converter according to this invention in which two circuits represented by the circuit block in FIG. 5 are accommodated. FIGS. 2 and 3 are cross sectional views taken along the lines II—II and III—III shown in FIG. 1 in arrowed directions, respectively.

The cooling air circulation or flow in the structure of the semiconductor converter 9 is achieved by means of a cooling fan 5 mounted on the ceiling of a housing 15 of the converter. A cooling air intake port 8 equipped with an air filter 7 is formed in the upper portion of a front door 6 of the housing 15 of the semiconductor converter 9 in place of the location of the intake port at the lower portion thereof as referred to with respect to the conventional structure. Partitioning means such as a partition plate 14 is disposed between the semiconductor units 3 installed one above another and located on the side of the front door 6 and resistors 4, which are disposed in parallel vertical rows, on the side of the latter so as to define a space 12 therebetween as an air duct or passage. As shown in FIG. 2, a reactor 1 and capacitors 2 are arranged side by side with respect to the resistors 4 and are not arranged at the rear portions of the resistors 4 with respect to the cooling air flow direction so as not to direct the cooling air with increased temperature towards the reactor 1 and the capacitors 2 after cooling the resistors 4. In the embodiment illustrated in FIGS. 1 to 3, the cooling fan 5 is disposed directly above the resistors 4 for effective cooling of the same. A cooling air introduced into the semiconductor converter 9 through the cooling air intake port 8 diverges for cooling the semiconductor units 3, and the diverging cooling air flows are again converged at the location of the duct 12 disposed behind the vertical row of the semiconductor units 3 located on the side of rear wall of the housing after cooling the respective semiconductor units 3. The converged cooling air flows downwardly and turns at the bottom of the semiconductor converter 9 so as to pass through air holes 13 formed in the lower part of the partition plate 14 and disposed on the lower side of the resistors 4 thereby to cool the lower resistor 4 and then upper resistors 4 in turn. The cooling air after cooling the resistors 4 is exhausted through the air exhaust port 10 externally of the semiconductor converter 9.

Figure 4:
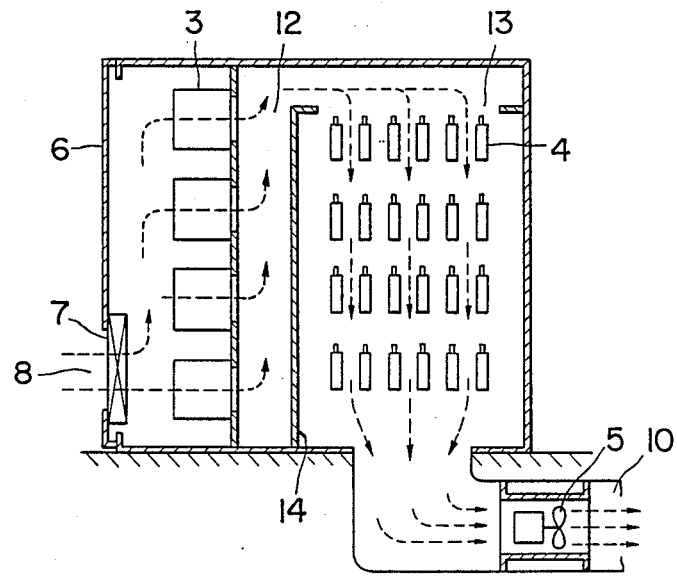
FIG. 4 is a side view, in vertical section, of another embodiment according to this invention.

FIG. 4 shows a side view, in vertical section, of another embodiment of the semiconductor converter according to this invention, in which the air intake port 8 and air exhaust port 10 are both disposed at the lower sides of the semiconductor converter and the partition plate 14 is located so as to define the air duct 12 so that the cooling air introduced into the semiconductor converter 9 through the intake port 8 and converged at the location of the duct 12 is forced to turn at the upper portion of the semiconductor converter for cooling the vertically aligned resistors 4 from the upper ones to the lower ones in turn.

Alternatively, the cooling fan 5 may be located at the air intake port 8 to forcibly introduce the cooling air into the semiconductor converter in place of the location at the exhaust port 10.

Figure 9:
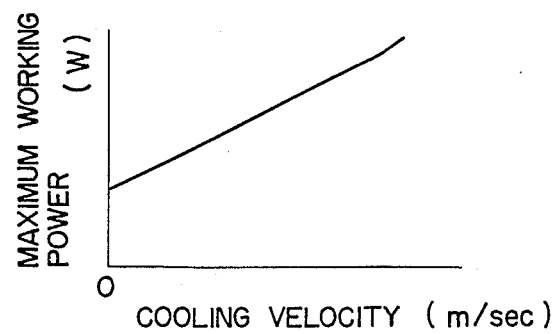
FIG. 9 is a graph representing a relationship between the cooling air velocity and the maximum working electric power.

As described hereinbefore, according to this invention, the cooling air flows diverging after uniformly cooling the semiconductor units 3 are converged again to thereafter cool the resistors 4 with substantially the whole amount of the introduced air, so that the velocity of the air for cooling the resistors is increased, and hence, the working electric power can be increased as will be understood from the representation of the relationship shown in FIG. 9. In addition, the cooling air of increased temperature is not directed towards the capacitor 2 having low heat resisting property, whereby the reliability of the whole structure of the semiconductor converter is improved.

What is claimed is:

1. A semiconductor converter provided with a cooling structure comprising:
    a housing provided with a panel board;
    cooling air intake means formed in said panel board for introducing cooling air into said housing;
    a plurality of semiconductor units installed one above another in said housing on the side of said panel board;
    a plurality of heat generating elements such as resistors installed in said housing behind said semiconductor units with respect to the direction of flow of the cooling air;

a cooling air duct means formed between said semiconductor units and said heat generating elements in such a manner that cooling air flows diverging for cooling said semiconductor units are converged and the converged air flow is directed towards said heat generating elements to cool the same in turn; and cooling air exhaust means for discharging the cooling air after cooling said heat generating element.

2. The semiconductor converter according to claim 1 wherein said cooling air intake means is an intake port formed in an upper portion of said panel board and said cooling air exhaust means is an exhaust port formed in a ceiling of said housing so that the converged cooling air flow after cooling said semiconductor units is directed to a lower portion of said heat generating elements through said duct means to cool lower heat generating elements and then upper heat generating elements in turn.

3. The semiconductor converter according to claim 1 wherein said cooling air intake means is an intake port formed in a lower portion of said panel board and said cooling air exhaust means is an exhaust port formed in a lower portion of a rear wall of said housing so that the converged cooling air flow after cooling said semiconductor units is directed to an upper portion of said heat generating elements through said duct means to cool upper heat generating elements and then lower heat generating elements in turn.

4. The semiconductor converter according to claim 1, further including a fan installed in said cooling air exhaust means for forcibly circulating and exhausting said cooling air from said semiconductor converter.

5. The semiconductor converter according to claim 1, further including a fan installed in said cooling air intake means for forcibly introducing the cooling air into said semiconductor converter.

6. The semiconductor converter according to claim 1 wherein said panel board is a door.

* * * * *